United States Patent [19]
Hofmeister

[11] Patent Number: 6,120,229
[45] Date of Patent: Sep. 19, 2000

[54] SUBSTRATE CARRIER AS BATCHLOADER

[75] Inventor: Christopher Hofmeister, Hampstead, N.H.

[73] Assignee: Brooks Automation Inc., Chelmsford, Mass.

[21] Appl. No.: 09/243,516

[22] Filed: Feb. 1, 1999

[51] Int. Cl.[7] .......................... B65G 49/07; H01L 21/68
[52] U.S. Cl. .......................... 414/217; 414/937; 414/940
[58] Field of Search .................................. 414/217, 937, 414/939, 940, 217.1

[56] References Cited

U.S. PATENT DOCUMENTS

| | | | |
|---|---|---|---|
| 2,500,815 | 3/1950 | Gerli et al. | 304/29 |
| 4,381,965 | 5/1983 | Maher, Jr. et al. | 156/345 |
| 4,532,970 | 8/1985 | Tullis et al. | 141/98 |
| 4,534,389 | 8/1985 | Tullis | 141/98 |
| 4,550,242 | 10/1985 | Uehara et al. | 219/121 |
| 4,674,936 | 6/1987 | Bonora | 414/217 |
| 4,674,939 | 6/1987 | Maney et al. | 414/292 |
| 4,676,709 | 6/1987 | Bonora et al. | 414/217 |
| 4,715,921 | 12/1987 | Maher et al. | 156/345 |
| 4,724,874 | 2/1988 | Parikh et al. | 141/98 |
| 4,730,976 | 3/1988 | Davis et al. | 414/749 |

(List continued on next page.)

FOREIGN PATENT DOCUMENTS

| | | |
|---|---|---|
| 0 340 345 A2 | 11/1989 | European Pat. Off. . |
| 0 340 345 A3 | 11/1989 | European Pat. Off. . |
| 0 340 345 B1 | 11/1989 | European Pat. Off. . |
| 63190338 | 8/1988 | Japan . |
| 63-300006 | 12/1988 | Japan . |
| 1-64232 | 3/1989 | Japan . |
| 1-157547 | 6/1989 | Japan . |
| 4-61146 | 2/1992 | Japan . |
| 4123430 | 4/1992 | Japan ................... 414/939 |
| 4-206547 | 7/1992 | Japan . |
| 10321696 | 12/1998 | Japan . |
| WO 86/00870 | 2/1986 | WIPO . |
| WO 87/07309 | 12/1987 | WIPO . |
| WO 90/14273 | 11/1990 | WIPO . |
| WO 93/18543 | 9/1993 | WIPO . |

OTHER PUBLICATIONS

Wafer Confinement For Control of Contamination in Microelectronics Aug. 1990 Solid State Tech. p. S1–S5, Claude Doche ACR Ergosmif® Man Brochure 15 pages.

*Primary Examiner*—Steven A. Bratlie
*Attorney, Agent, or Firm*—Perman & Green, LLP

[57] ABSTRACT

A semiconductor wafer batchloading system comprises a portable carrier for supporting and transporting wafers in a substantially particle free environment. A carrier door is movable between an open position and a closed position overlying a carrier port for sealing the interior of the carrier from the surrounding environment. The carrier is movable on a platform between withdrawn and advanced positions for delivering multiple wafers to a wafer receiving station. A plurality of spaced rack members support the wafers, each being aligned with an associated one of a plurality of spaced shelves on the wafer receiving station. The wafer receiving station may be located within a load lock defining a chamber having a substantially particle free environment and including a load lock port with a load lock door movable between a closed position overlying the load lock port and an open position spaced therefrom. A locking mechanism releasably locks the carrier door to the carrier. The carrier door drive mechanism includes a generally planar door opener movable between a lowered position and a raised position substantially coextensive with the carrier port. The door opener is also movable between a first position proximate the carrier port and a second position distant from the carrier port and a removal mechanism operates the locking mechanism to release the carrier door from the carrier port and supports the carrier door when the carrier door has been released from the carrier.

44 Claims, 8 Drawing Sheets

U.S. PATENT DOCUMENTS

| | | | |
|---|---|---|---|
| 4,739,882 | 4/1988 | Parikh et al. | 206/454 |
| 4,802,809 | 2/1989 | Bonora et al. | 414/217 |
| 4,815,912 | 3/1989 | Maney et al. | 414/217 |
| 4,951,601 | 8/1990 | Maydan et al. | 118/719 |
| 4,995,430 | 2/1991 | Bonora et al. | 141/98 |
| 5,112,277 | 5/1992 | Cruz et al. | 454/195 |
| 5,133,284 | 7/1992 | Thomas et al. | 118/719 |
| 5,166,884 | 11/1992 | Maney et al. | 364/468 |
| 5,169,272 | 12/1992 | Bonora et al. | 414/217 |
| 5,180,276 | 1/1993 | Hendrickson | 414/752 |
| 5,183,370 | 2/1993 | Cruz | 414/416 |
| 5,193,658 | 3/1993 | Tellden | 192/138 |
| 5,306,380 | 4/1994 | Hiroki | 156/345 |
| 5,333,986 | 8/1994 | Mizukami et al. | 414/217 |
| 5,364,219 | 11/1994 | Takahashi et al. | 414/217 |
| 5,364,222 | 11/1994 | Akimoto et al. | 414/416 |
| 5,382,128 | 1/1995 | Takahashi et al. | 414/404 |
| 5,395,198 | 3/1995 | Duffy et al. | 414/217 |
| 5,404,894 | 4/1995 | Shiraiwa | 134/66 |
| 5,431,600 | 7/1995 | Murata et al. | 454/187 |
| 5,435,682 | 7/1995 | Crabb et al. | 414/217 |
| 5,474,410 | 12/1995 | Ozawa et al. | 414/217 |
| 5,527,390 | 6/1996 | Ono et al. | 118/719 |
| 5,562,383 | 10/1996 | Iwai et al. | 414/217 |
| 5,570,994 | 11/1996 | Somekh et al. | 414/786 |
| 5,586,585 | 12/1996 | Bonora et al. | 141/93 |
| 5,588,789 | 12/1996 | Muka et al. | 414/217 |
| 5,590,996 | 1/1997 | Thompson et al. | 414/416 |
| 5,607,276 | 3/1997 | Muka et al. | 414/331 |
| 5,609,459 | 3/1997 | Muka | 414/217 |
| 5,613,821 | 3/1997 | Muka et al. | 414/217 |
| 5,664,925 | 9/1997 | Muka et al. | 414/217 |
| 5,743,704 | 4/1998 | Caveney et al. | 414/445 |
| 5,752,796 | 5/1998 | Muka | 414/217 |
| 5,765,983 | 6/1998 | Caveney et al. | 414/217 |

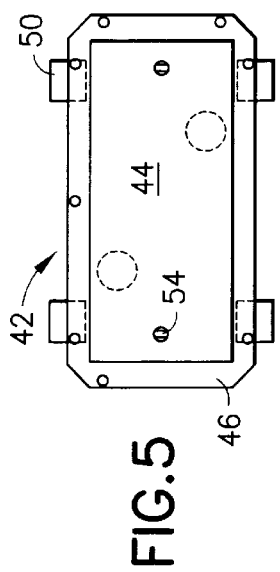
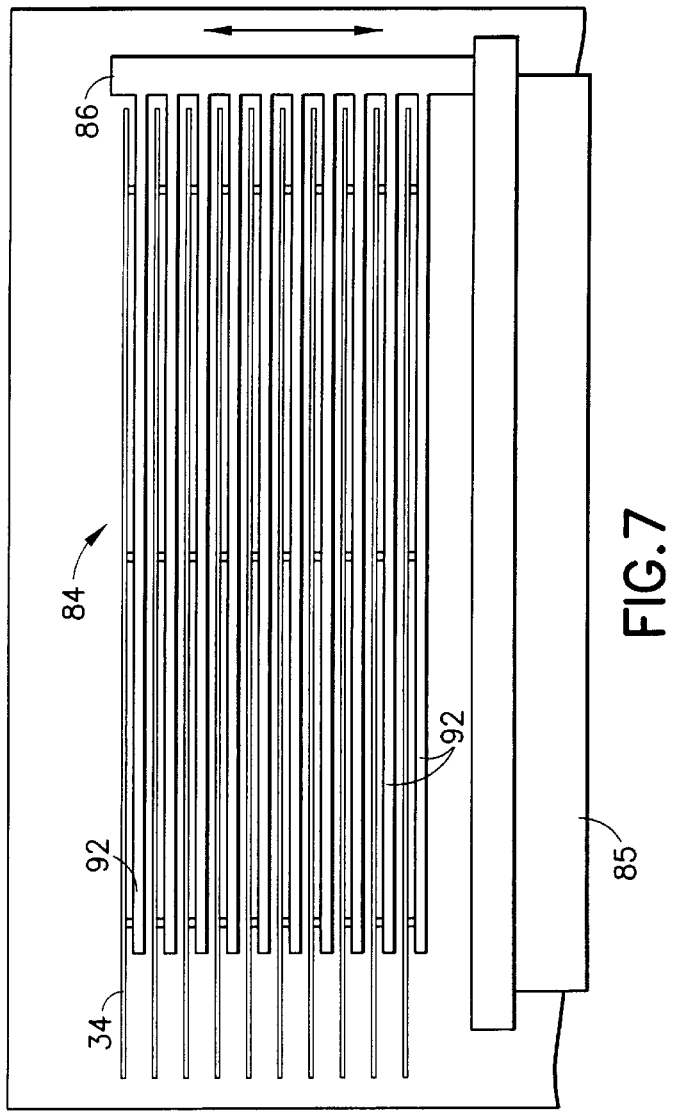

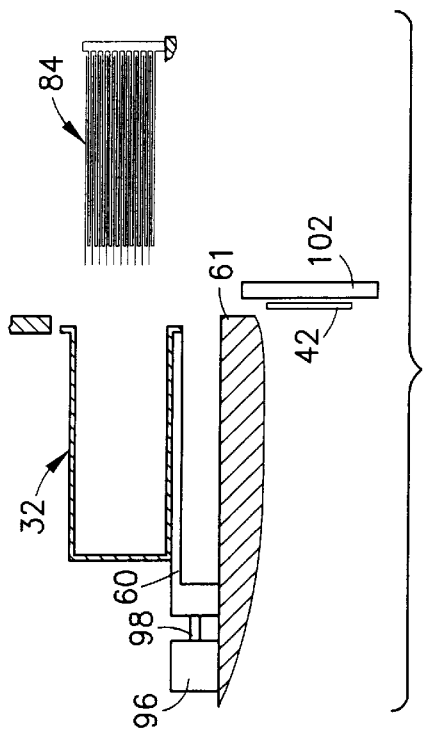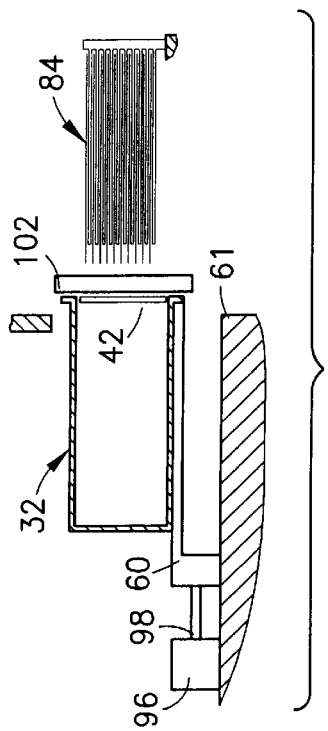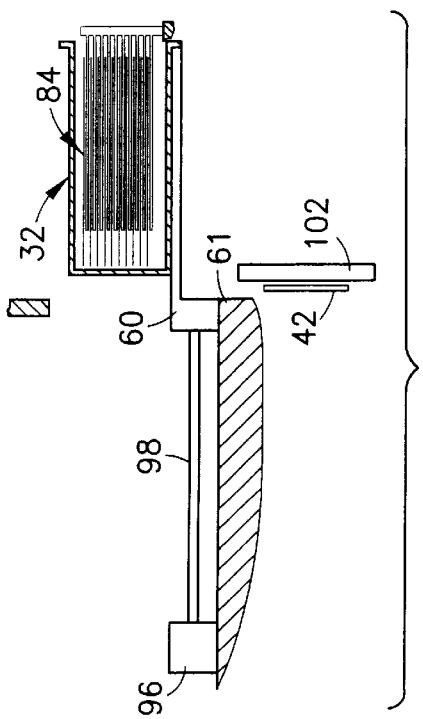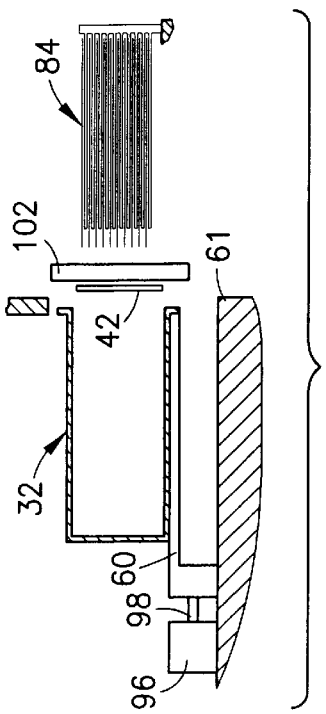

SUBSTRATE CARRIER AS BATCHLOADER

BACKGROUND OF THE INVENTION

1. Field of the Invention

The present invention relates to standardized mechanical interface systems for reducing particle contamination and more particularly to apparatus employing sealed containers suitable for use in semiconductor processing equipment to prevent particle contamination. Still more particularly, the invention relates to such systems enabling direct transfer, without use of an articulated arm, of multiple semiconductor wafers at a time between a transportable container or carrier and a controlled environment load lock chamber as they await further transfer to a processing station, or elsewhere. Throughput of the manufacturing process is thereby significantly increased while simplifying the mechanisms involved.

Throughout this disclosure, the term "wafer" will be used for purposes of consistency to refer to planar substrates such as silicon wafers and glass flat panels, but it will be understood that it is intended to be used in the broad context so as to be applicable to all substrates. Such substrates are circular and were previously sized to a diameter of 200 mm and a thickness of approximately 0.760 mm although, currently, the diameter of choice has evolved to 300 mm with the same thickness.

2. Description of the Prior Art

Control of particulate contamination is imperative for cost effective, high-yielding and profitable manufacturing of VLSI circuits. Because design rules increasingly call for smaller and smaller lines and spaces, it is necessary to exert greater and greater control on the number of particles and to remove particles with smaller and smaller diameters.

Some contamination particles cause incomplete etching in spaces between lines, thus leading to an unwanted electrical bridge. In addition to such physical defects, other contamination particles may cause electrical failure due to induced ionization or trapping centers in gate dielectrics or junctions.

The main sources of particulate contamination are personnel, equipment, and chemicals. Particles given off by personnel are transmitted through the environment and through physical contact or migration onto the wafer surface. People, by shedding of skin flakes, for example, are a significant source of particles that are easily ionized and cause defects.

Modern processing equipment must be concerned with particle sizes which range from below 0.01 micrometers to above 200 micrometers. Particles with these sizes can be very damaging in semiconductor processing. Typical semiconductor processes today employ geometries which are 1 micrometer and under. Unwanted contamination particles which have geometries measuring greater than 0.1 micrometer substantially interfere with 1 micrometer geometry semiconductor devices. The trend, of course, is to have smaller and smaller semiconductor processing geometries.

In the recent past, "clean rooms" were established in which through filtering and other techniques, attempts were made to remove particles having geometries of 0.03 micrometer and above. There is a need, however, to improve the processing environment. The conventional "clean room" cannot be maintained as particle free as desired. It is virtually impossible to maintain conventional clean rooms free of particles of a 0.01 micrometer size and below. Although clean room garments reduce particle emissions, they do not fully contain the emissions. It has been found that as many as 6000 particles per minute are emitted into an adjacent one cubic foot of space by a fully suited operator.

To control contamination particles, the trend in the industry is to build more elaborate (and expensive) clean rooms with HEPA and ULPA recirculating air systems. Filter efficiencies of 99.999% and up to ten complete air exchanges per minute are required to obtain an acceptable level of cleanliness.

Particles within the equipment and chemicals are termed "process defects."

To minimize process defects, processing equipment manufacturers must prevent machine generated particles from reaching the wafers, and suppliers of gases and liquid chemicals must deliver cleaner products. Most important, a system must be designed that will effectively isolate wafers from particles during storage, transport and transfer into processing equipment. The Standard Mechanical Interface (SMIF) system has been devised, and used, to reduce particle contamination by significantly reducing particle fluxes onto wafers. This end is accomplished by mechanically ensuring that during transport, storage and processing of the wafers, the gaseous media (such as air or nitrogen) surrounding the wafers is essentially stationary relative to the wafers and by ensuring that particles from the ambient outside environment do not enter the immediate internal wafer environment.

The SMIF concept is based on the realization that a small volume of still, particle-free air, with no internal source of particles, is the cleanest possible environment for wafers.

A typical SMIF system utilizes (1) minimum volume, dustproof boxes or carriers for storing and transporting (2) open rack wafer cassettes, and (3) doors on the boxes or carriers designed to mate with doors on the interface ports on the processing equipment and the two doors being opened simultaneously so that particles which may have been on the external door surfaces are trapped ("sandwiched") between the doors.

In a typical SMIF system, a box or carrier is placed at the interface port and latches release the box door and the port door simultaneously. A mechanical elevator lowers the two doors, with the cassette riding on top. A manipulator picks up the cassette and places it onto the cassette port/elevator of the equipment. After processing, the reverse operation takes place.

SMIF systems have proved to be effective and this fact has been shown by experiments using SMIF components both inside and outside a clean room. The SMIF configuration achieved a ten-fold improvement over the conventional handling of open cassettes inside the clean room.

Using SMIF systems, it was customary to carry a large number of the wafers within the box or carrier by supporting them in a spaced relationship by means of a cassette. Using this technique, the cassette would be loaded with a supply of wafers, transported into the box or carrier, then subsequently wafers would be removed from the cassette in the carrier one by one for placement into a reception chamber at the site of further processing.

A recent development relating to SMIF systems is presented in U.S. Pat. No. 5,752,796 to Muka which discloses the use of such a portable carrier for transporting multiple semiconductor wafers in a substantially particle free environment. A cassette freely received within the carrier for supporting the wafers in spaced generally stacked relationship is delivered to an environmentally clean load lock. A mini-environment defines an interior region adjacent the load lock for the engageable reception of the carrier and sealingly isolates the load lock chamber and the interior of the carrier from the surrounding atmosphere. Transfer mechanisms serve to retrieve the cassette from the carrier and move the carrier into the load lock chamber while maintaining it in a particle free environment. A first transport mechanism within the mini-environment retrieves the cassette from the carrier and moves it into its interior region and a second transport mechanism within the load lock retrieves the cassette from the interior region of the mini-environment and moves it into the load lock chamber. To aid in moving the cassette into the interior region, a hood of the mini-environment is movable between lowered and raised positions while maintaining a capillary seal with its upstanding walls. Sensors inform whether a cassette is present in the SMIF box, whether wafers are properly positioned in the cassette, and whether the cassette is properly gripped as it is being moved into the interior region. Laminar flow air is continually directed through the interior region of the mini-environment and filtered to remove foreign particles from the wafers being supported in the cassette.

The invention results in an efficient, rapid operating, unified and simplified design which assures maximum throughput of processed wafers while protecting them from the outside environment throughout performance of the process steps. It moves a cassette containing a plurality of wafers into the vacuum lock, while vented, while maintaining the clean conditions of the SMIF box by utilizing the load arm already available in existing load lock constructions instead of a separate arm in a SMIF unloader or within the mini-environment. Additionally, the system of the invention introduces progressive cross flows of air as the SMIF box is opened and the cassette with its multiple wafers therein is brought into the mini-environment.

Unfortunately, the use of cassettes requires additional equipment inventory, increases the volume requirement for the box or carrier, adds to the complexity of the system, increases the cost of original equipment and for upkeep of the equipment of the system. Also, risks of contamination, notwithstanding vigorous air circulation, are always present when using cassettes because the plastic material of which they are constructed often outgasses and it is difficult to control such an occurrence.

More recent improvements have eliminated the need for cassettes and examples of such newer technology is found in a number of commonly assigned U.S. Patents, for example, U.S. Pat. No. 5,609,459 to Muka, and U.S. Pat. Nos. 5,607,276, 5,613,821, and 5,664,925 to Muka et al.

It was in light of the foregoing state of the art that the present invention has been conceived and is now reduced to practice. Specifically, the invention results from efforts to reduce equipment inventory and therefore initial cost, provide a simpler and more compact construction, reduce the cost of maintenance, and increase throughput of processed items.

SUMMARY OF THE INVENTION

According to the invention, a system is provided for batch loading semiconductor wafers into a load lock from a portable carrier used for supporting a plurality of the wafers in spaced relationship and transporting them in a particle free environment. The carrier is supported adjacent a load lock chamber which also has a particle free environment. A carrier door is movable between an open position and a closed position overlying a carrier port for sealing the interior of the carrier from the surrounding environment. The carrier is movable on a platform between withdrawn and advanced positions for delivering multiple wafers to a wafer receiving station. A plurality of spaced rack members support the wafers, each being aligned with an associated one of a plurality of spaced shelves on the wafer receiving station. The wafer receiving station may be located within a load lock defining a chamber having a substantially particle free environment and including a load lock port with a load lock door movable between a closed position overlying the load lock port and an open position spaced therefrom. Alternatively, the wafer receiving station may be associated with a toll front end or a processing chamber of a batch tool. A locking mechanism releasably locks the carrier door to the carrier. The carrier door drive mechanism includes a generally planar door opener movable between a lowered position and a raised position substantially coextensive with the carrier port. The door opener is also movable between a first position proximate the carrier port and a second position distant from the carrier port and a removal mechanism operates the locking mechanism to release the carrier door from the carrier port and supports the carrier door when the carrier door has been released from the carrier.

The invention results in a construction by reason of which the purposes of the carrier and cassette are unified while eliminating the need for a cassette and the inventory which is undesirably associated with the use of cassettes. The risk of exposing wafers to undesirable particle contamination present in moving air as in traditional SMIF loaders where the cassette is lowered from a SMIF box then transferred to a load lock is eliminated. In the instance of the invention, wafers are loaded in a batch configuration which reduces overhead time and results in higher tool throughput.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and, together with the description, serve to explain the principles of the invention in general terms. Like numerals refer to like parts throughout the disclosure.

BRIEF DESCRIPTION OF THE DRAWINGS

In the drawings:

FIG. 5 is an elevation view illustrating the carrier door;

FIGS. 5A and 5B are detail illustrations depicting successive positions of components illustrated in FIG. 5;

FIG. 7 is a detail side elevation view illustrating a part of FIG. 6; and

FIGS. 8A through 8H are successive diagrammatic views depicting the operation of the invention.

DETAILED DESCRIPTION OF THE PREFERRED EMBODIMENTS

Figure 1:
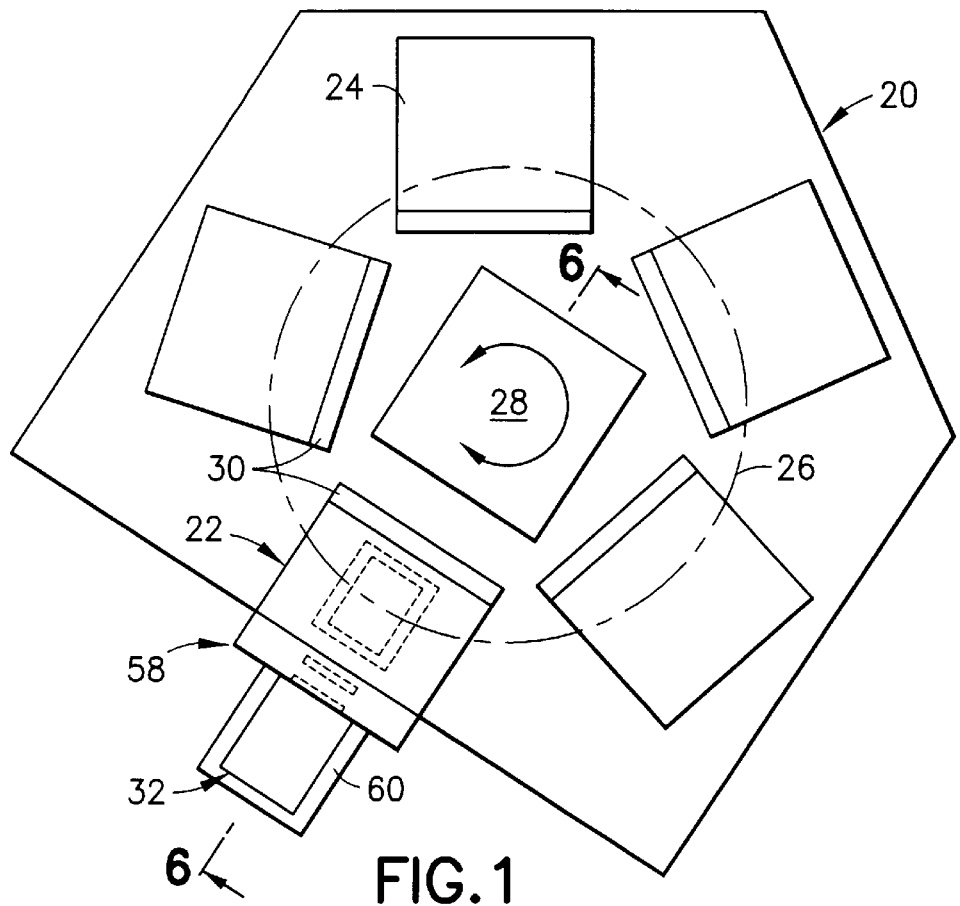
FIG. 1 is a top plan diagrammatic view of a wafer processing system embodying the present invention, with the cover removed from the transport chamber.

Turn now to the drawings and, initially, to FIG. 1 which illustrates a processing system 20 for operating on silicon planar substrates such as wafers and flat panels. As noted above, throughout the remainder of this disclosure, the term "wafer" will be used for purposes of consistency to refer to such substrates, but it will be understood that it is intended to be used in the broad context so as to be applicable to all substrates. The invention is especially beneficial for operating on the newer size of substrates.

The processing system 20 includes a load lock 22 for initially receiving wafers to be processed and a plurality of single-wafer processing stations 24 for operations on the surfaces of the wafers such as imaging, plasma etching, and the like. It is typical for the processing stations 24 to be arranged about a closed locus as indicated by a dashed line 26. A transport chamber 28 is disposed concentrically within the load lock 22 and processing stations 24 for singly transferring wafers to be processed and after processing between the load lock and one or more of the processing stations 24. A plurality of isolation valves 30 are individually provided at the interfaces of the several processing stations 24 and the transport chamber 28 and between the load lock 22 and the transport chamber 28.

As previously noted, for some time now, it has been known to employ transportable SMIF boxes or containers, herein referred to as "carriers", for maintaining articles, such as semiconductor wafers, clean. This has been achieved by maintaining within each carrier a substantially particle free environment while the wafers are being brought to, or removed from, the processing system 20. Previously, it was customary to carry a large number of the wafers within the carrier by supporting them in a spaced relationship by means of a cassette (not shown). Using this technique, the cassette would be loaded with a supply of wafers, transported into the carrier, then subsequently wafers would be removed from the cassette within the carrier one by one for placement in the load lock 22 or the cassette would be transferred with the wafers within the clean mini-environment existing between the carrier, SMIF box, or the like, and the wafer processing equipment. The SMIF box was a bottom loading design and generally was used to carry substrates sized to a diameter of 200 mm. More recently, carriers are of the FOUP ("front opening unified pod") design intended to carry substrates sized to a diameter of 300 mm.

Figure 2:
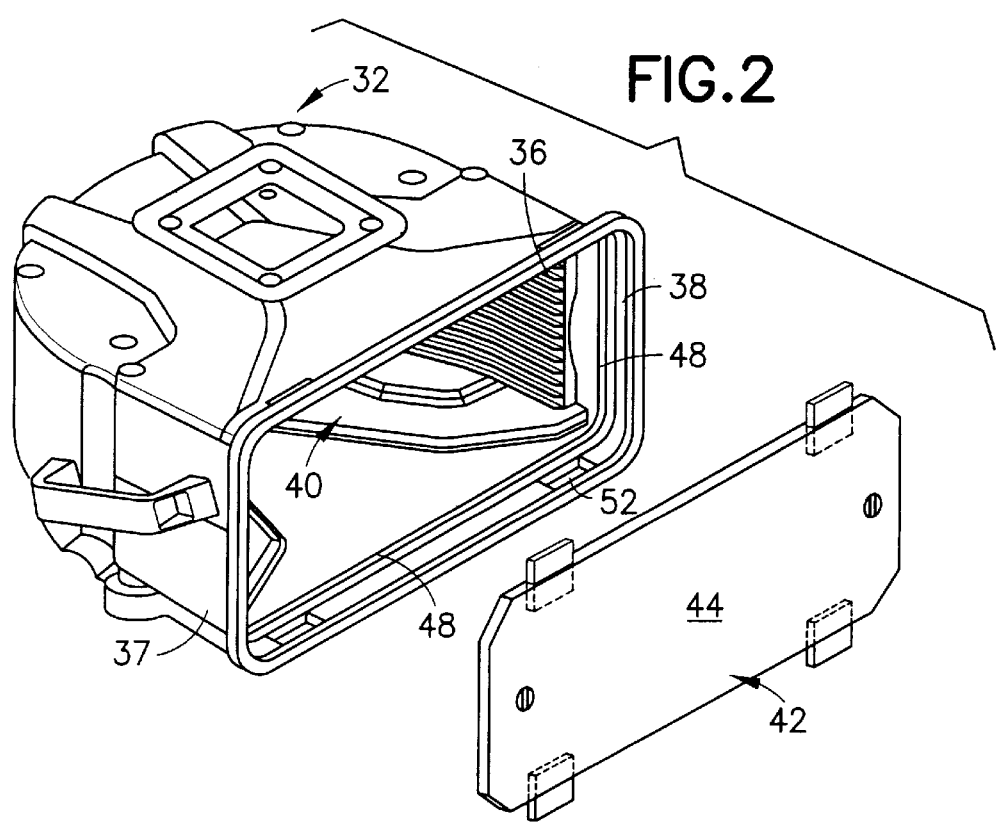
FIG. 2 is a perspective view of a portable carrier of the FOUP ("front opening unified pod") design for supporting and transporting a plurality of wafers in spaced relationship.
Figure 3A:
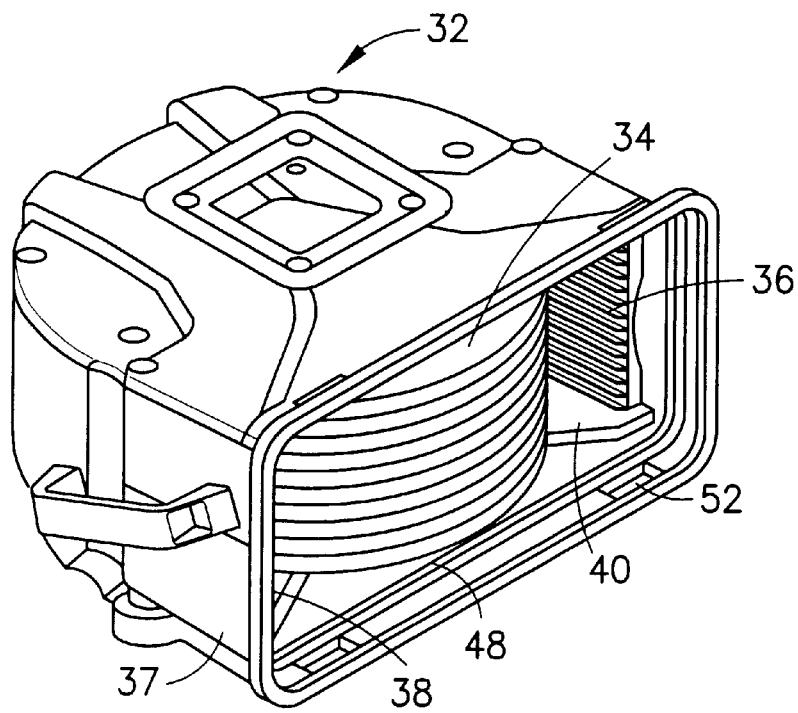
FIG. 3A is a top perspective view of the portable carrier illustrated in FIG. 2 but containing a complement of wafers.
Figure 3B:
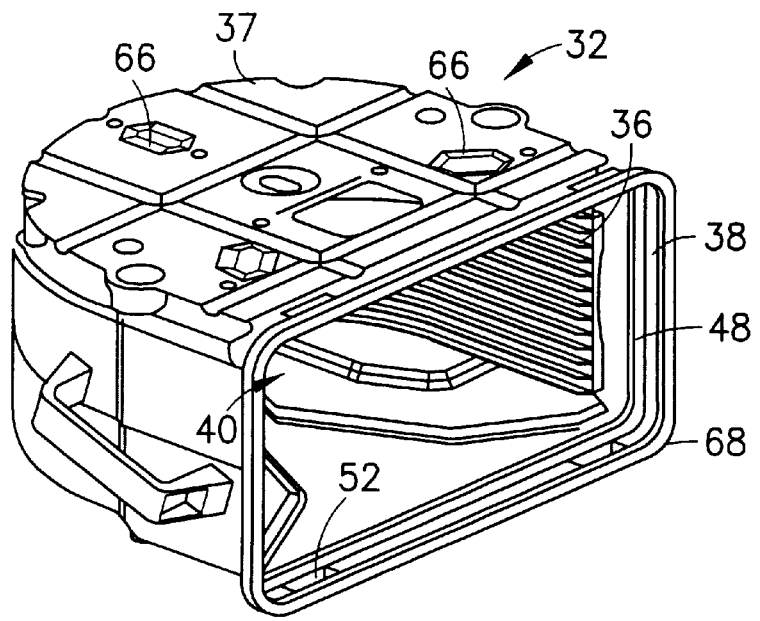
FIG. 3B is a bottom perspective view of the portable carrier illustrated in FIG. 2 but without a complement of wafers.

According to the invention, turning now to FIGS. 2 and 3, a modified portable carrier 32 of the FOUP design is provided for supporting and transporting a plurality of wafers 34 (FIG. 3A) in spaced relationship in a substantially particle free environment. The carrier 32 has a plurality of rack members 36 for supporting the wafers generally horizontally, in a generally vertically spaced relationship. At any one time, all or only some of the rack members 36 may actually be supporting wafers.

Figure 4A:
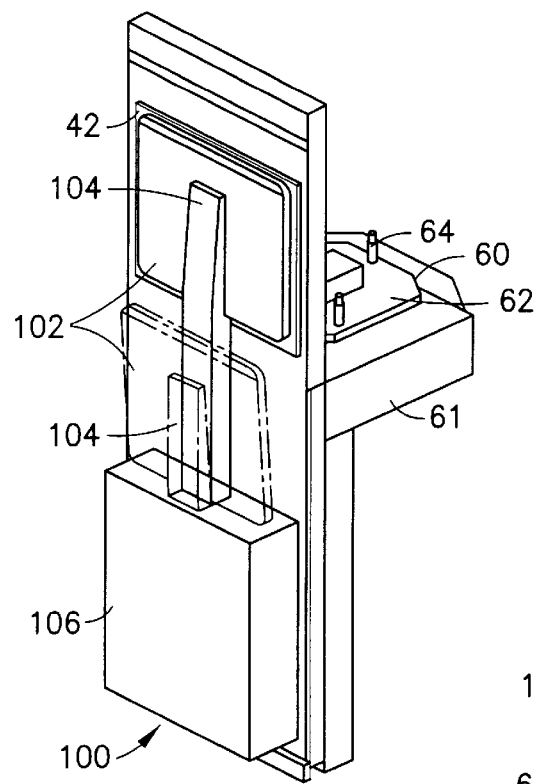
FIG. 4A is a perspective view of the carrier support and carrier door drive and opening mechanism with the carrier door closed.
Figure 4C:
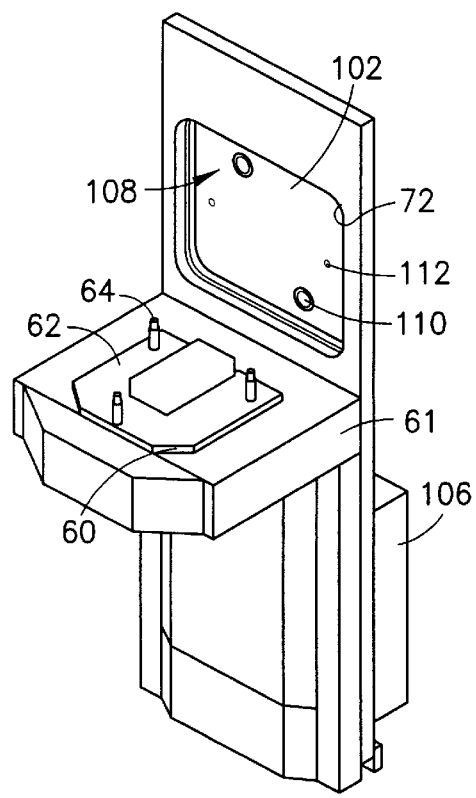
FIG. 4C is a perspective view of the components illustrated in FIGS. 4A and 4B but taken from the other side.

The carrier 32 includes a housing 37 with a carrier port 38 for providing access to the interior 40 thereof. A carrier door 42 on the carrier is movable between a closed position (FIG. 4A) overlying the carrier port and an open position (FIG. 4B) spaced from the carrier port. The carrier door 42 is illustrated as including a generally rectangular plate 44 and has a peripherally extending continuous raised flange 46. A suitable seal 48 is interposed between the flange 46 and the carrier port 38 for sealing the interior 40 of the carrier from the surrounding atmosphere when the carrier door is in the closed position. For selectively locking the carrier door 42 in place overlying the carrier port 38 and with the flange 46 firmly engaged with the seal 48, a plurality of latch members 50 are provided on the carrier door at peripherally spaced locations movable between an extended, solid line, locking position (FIGS. 2 and 5) so as to be engaged with respectively positioned locking recesses 52 on the carrier adjacent the carrier port 38 and a retracted, dashed line, release position disengaged from the locking recesses. Suitable keyway mechanisms externally indicated by latch keyways 54 are operably connected to the latch members for moving the latch members between the locking position and the release position. The mechanisms (not shown) may be linkages or may be solenoid operated or may be of other appropriate design. In a typical manner, when the latch keyways 54 are vertically oriented (FIG. 5A), the latch members 50 are extended such that the carrier door is closed and locked with the flange 46 bearing firmly against the carrier port 38 with the seal 48 interposed between the flange and the port to maintain the particle free environment within the interior 40 of the carrier. When the latch keyways 54 are horizontally oriented (FIG. 5B), the latch members 50 are retracted such that the carrier door is unlocked and capable of removal from the carrier port 38. In this latter condition, the carrier door 42 is free to be removed from the carrier in a manner to be described below.

Also, according to the invention, an isolation housing or mini-environment 58 (see especially FIGS. 6, 6A, 6B) is provided for sealingly isolating the load lock 22 and the interior 40 of the carrier 32 from the surrounding atmosphere. The carrier is brought in some suitable fashion from a remote location, then placed on a platform 60 movably mounted on a base 61 which, in turn, is a part of the mini-environment 58 and projects in a direction away from the processing system 20. An upper surface 62 of the platform 60 is provided with a plurality of upstanding posts 64 properly spaced to be received in matching depressions 66 which are provided in a bottom surface of the housing 37 of the carrier (see FIG. 3B). When the posts 64 are fully engaged with the depressions 66, a front surface 68 of the carrier 32 is proximate an outer surface 70 of the mini-environment 58.

The mini-environment has an aperture 72 which is generally aligned with the load lock 22 but spaced therefrom and when the carrier is seated on the platform 60, the carrier door 42 projects through the aperture into the interior of the mini-environment. A suitable seal 74 of flexible material is provided between the mini-environment 58 and the carrier when the carrier is supported on the platform 60 and advanced toward the outer surface 70. The seal 74 encompasses the carrier port 38 and the aperture 72 in the mini-environment and thereby isolates the interior of the carrier, the interior of the mini-environment and the load lock from the surrounding atmosphere.

The load lock 22 defines a chamber 76 therein having a substantially particle free environment and includes a load lock port 78 opening into the load lock chamber. As noted previously, the load lock 22 is positioned intermediate the carrier 32 and the transport chamber 28. A load lock door 80 is suitably mounted on the load lock for movement between a closed position overlying the load lock port 78 and an open position spaced therefrom.

Figure 6:
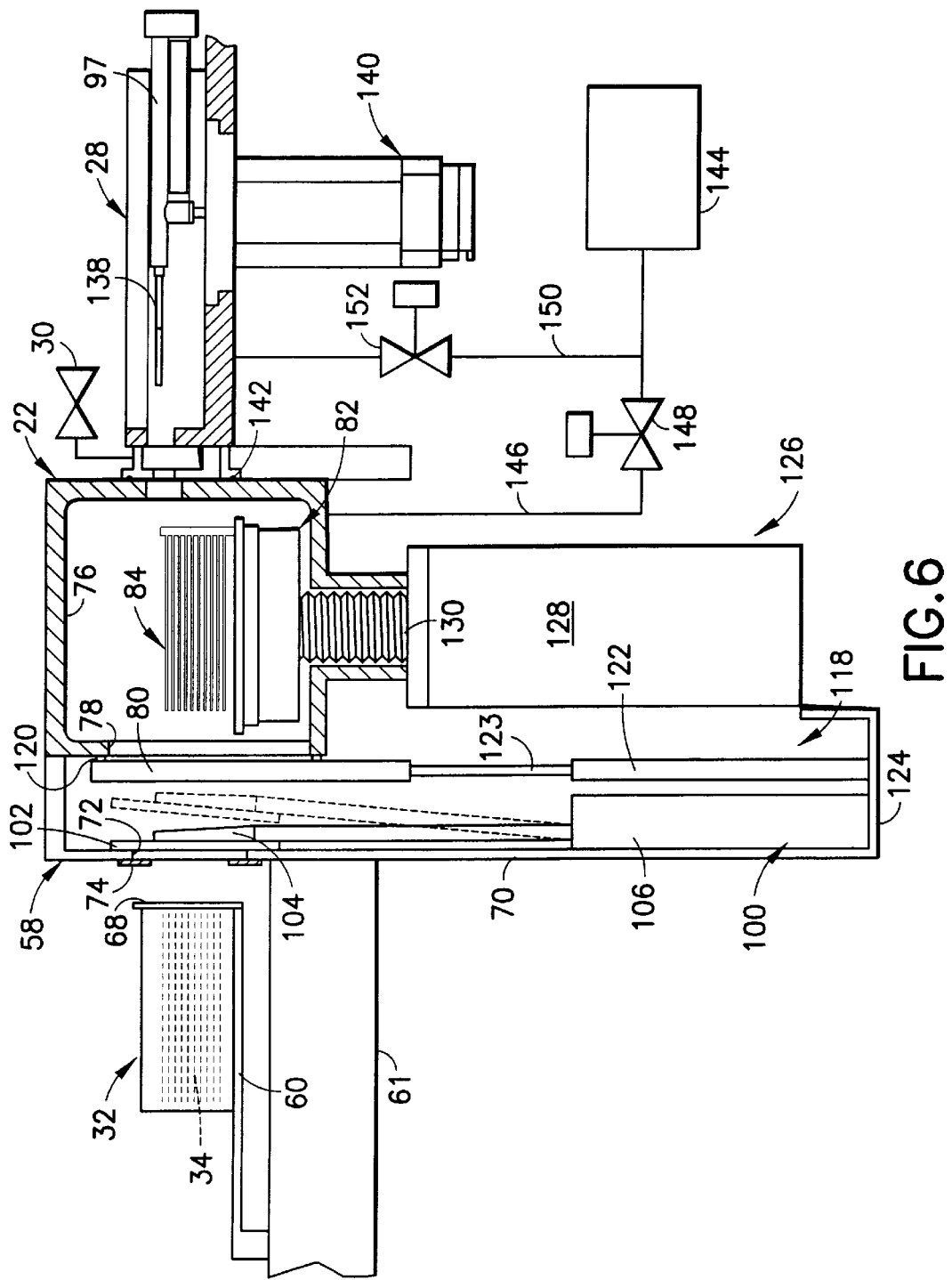
FIG. 6 is a diagrammatic side elevation view, certain parts being shown in section for clarity, illustrating in greater detail certain components illustrated in FIG. 1.
Figure 6A:
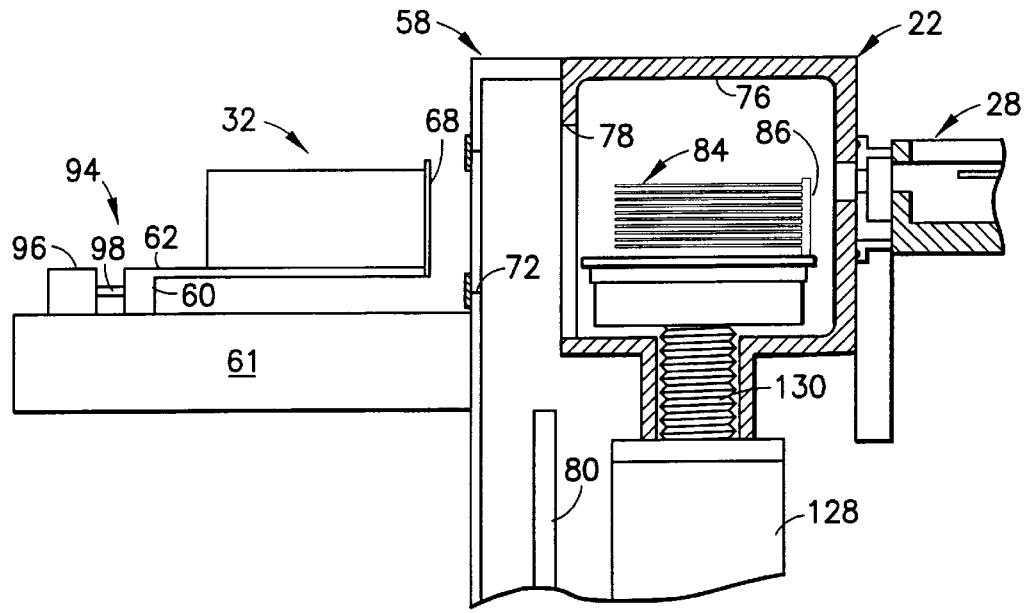
FIG. 6A is a diagrammatic detail side elevation view, certain parts being cut away and/or shown in section for clarity, illustrating in greater detail certain components illustrated in FIG. 6 and indicating the carrier door in its closed position.
Figure 6B:
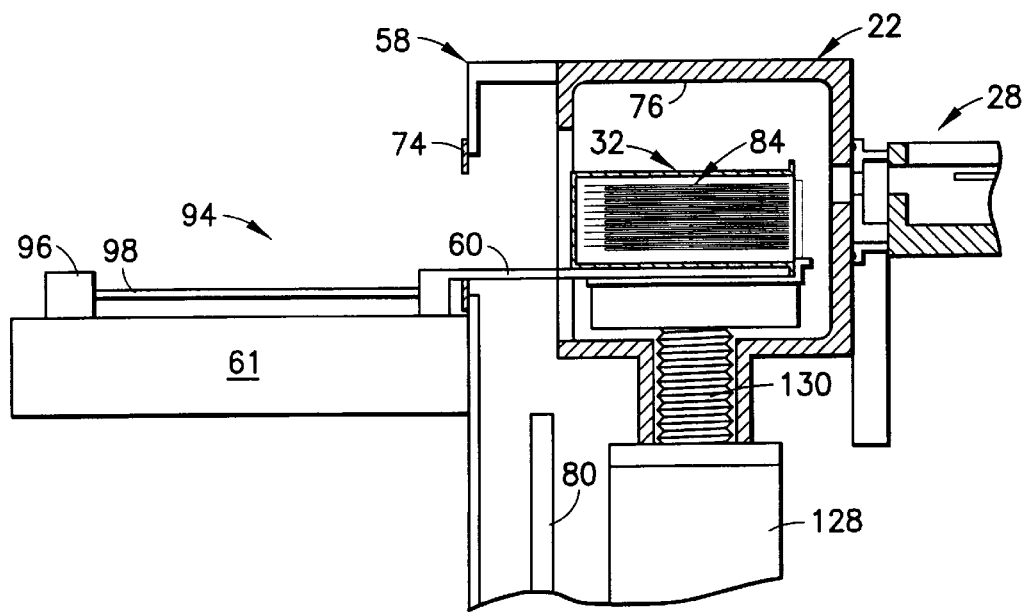
FIG. 6B is a diagrammatic side elevation view illustrating a portion of FIG. 2, similar to FIG. 6A, but indicating the carrier door in its open position.
Figure 8A:
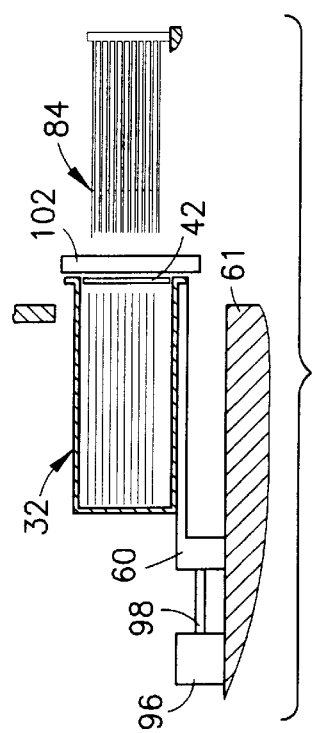
Figure 8C:
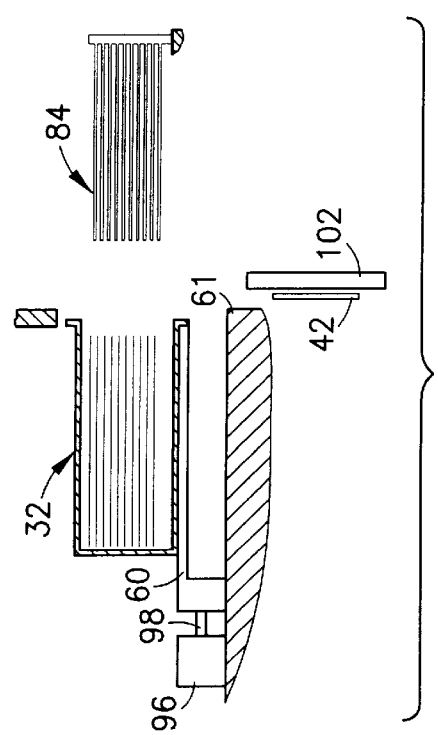
Figure 8B:
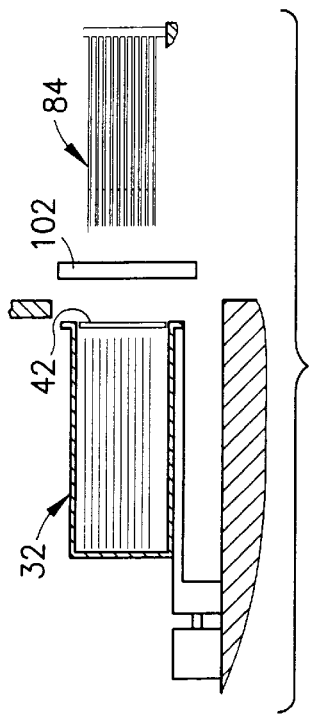
Figure 8D:
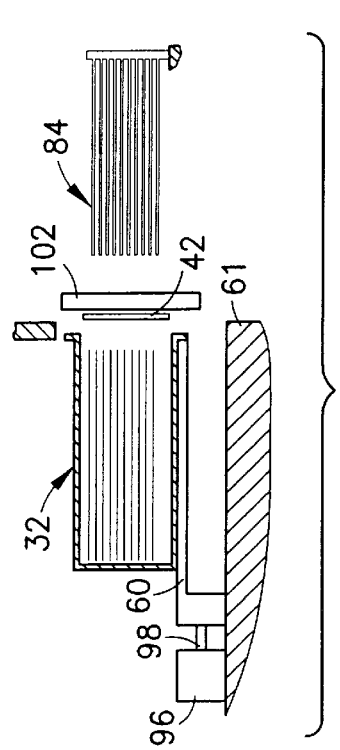

With continuing reference to FIGS. 6, 6A and 6B, and with new reference to FIG. 7, a multilevel wafer receiving station 84 is mounted on a receiving station base 85. As seen more clearly in FIG. 7, the multilevel wafer receiving station 84 includes a mounting manifold 86 which is suitably mounted on and projects upwardly from the receiving station base 85. A plurality of vertically spaced support plates 92 are integral with the mounting manifold 86 and project outwardly from the mounting manifold in the direction of the carrier 32 and lie in equally spaced parallel planes.

The spacing between the support plates 92 is substantially greater than the thickness of a wafer 34 for reasons which will become clear as this description proceeds and each support plate is adapted to support a wafer in a generally horizontal plane. Each of the plurality of spaced support plates 92 is aligned with one of the rack members 36 when the load arm is in the active position and, therefore, with an associated wafer 34 supported in the carrier. In order for movement of the carrier 32 toward the multilevel wafer receiving station 84 to commence in the manner about to be described, the load lock door 80 and the carrier door 42 must both be opened and moved to a remote location as seen in FIG. 6A.

Turning again to FIGS. 6A and 6B, a shuttle mechanism 94 is provided for moving the platform 60 between the withdrawn (solid line) position and the advanced (dashed line) position receiving the wafer receiving station into its interior 40. The shuttle mechanism 94 includes a suitable shuttle actuator 96 and an actuator rod 98 kinematically connecting the shuttle actuator and the platform 60. As the shuttle mechanism 94 continues to operate, viewing FIGS. 6, 6A, and 6B, the carrier 32 with its load of wafers 34 is advanced from left to right, through the aperture 72 of the mini-environment 58, then through the aperture 72 of the load lock 22 until it is fully received in the load lock and fully envelopes the wafer receiving station 84. As earlier noted, the pitch of the support plates 92 is the same as that of the rack members 36. Each support plate 92 thereby is caused to engage from beneath an associated wafer 34 such that the wafer receiving station 84 thereby simultaneously retrieves, as a grouping, all of the wafers earlier in the carrier 32. When the carrier 32 reaches its extreme rightward movement, the multilevel wafer receiving station 84, is raised a sufficient distance to lift the wafers, as a grouping, off their associated spaced rack members. Thereupon, while the receiving station 84 retains that elevated positioning, the shuttle mechanism 94 is again operated, this time in such a manner as to move the carrier to the left, to the retracted position, leaving behind on the wafer receiving station 84 the grouping of the wafers 34 in the load lock chamber 76.

After the grouping of the wafers 34 is so positioned on the multilevel wafer receiving station 84 in the load lock chamber 76, a transport arm 97 FIG. 6 within the transport chamber 28 may be operated for retrieving the wafers 34, one at a time, from the multilevel wafer receiving station and delivering it to a specified one of the plurality of processing stations 24.

In order to operate the multilevel wafer receiving station 84 in the manner just described, it is necessary first to coordinate the opening of the carrier door 42 and of the load lock door 80. The mechanism for achieving this coordinated operation will now be described. Initially, the carrier door is opened, then the load lock door is opened, then both doors together are moved to a location remote from the region between the interior of the carrier and the load lock chamber.

A carrier door drive mechanism 100 includes a generally planar door opener 102 movable between a lowered position (FIG. 4B) and a raised position (FIG. 4A) substantially coextensive with the carrier port 38. Viewing FIG. 6, the door opener 102 is also movable between a first solid-line position proximate the carrier port or the aperture 72 of the mini-environment 58 and a second dashed-line position distant from the carrier port. To this end, the door opener 102 is mounted on an extendible transport member 104 which is suitable operated for both translation and pivoting movement by an operating unit 106 of the drive mechanism 100. A mechanism which performs satisfactorily as the carrier door drive mechanism 100 for purposes of the invention is commercially available from Jenoptic-Infab of Jena, Germany and recognized under the trademark "FIXLOAD". Alternate approaches for providing carrier door drive mechanisms are disclosed in U.S. Pat. No. 5,609,459 to Muka and in U.S. Pat. Nos. 5,607,276, 5,613,821, and 5,664,925 to Muka et al.

The carrier door drive mechanism 100 also includes a removal mechanism generally indicated at 108 for operating the earlier mentioned latch members 50 so as to release the carrier door 42 from the carrier port 38 and simultaneously for supporting the carrier door when the latch members have been operated to release the carrier door from the carrier. The removal mechanism 108 includes selectively operable suction cups 110, or the like, on the door opener 102 which are engageable with the carrier door 42 when the carrier 32 has been advanced by the shuttle actuator 96 into abutting relationship with the door opener. Operation of the suctions cups 110 thus cause the firm, though temporary, attachment of the carrier door to the door opener.

Simultaneously, keys 112 of a suitably operable key mechanism on the door opener 102 are engageable with the latch keyways 54 on the carrier door 42 for operating the latch members. As earlier mentioned, when the latch keyways 54 are vertically oriented (FIG. 5A), the latch members 50 are extended such that the carrier door is closed and locked with the flange 46 bearing firmly against the carrier port 38 with the seal 48 interposed between the flange and the port to maintain the particle free environment within the interior 40 of the carrier. When the latch keyways 54 are horizontally oriented (FIG. 5B), the latch members 50 are retracted such that the carrier door is unlocked and capable of removal from the carrier port 38. In this latter condition, the carrier door 42 is free to be removed from the carrier in a manner to be described below.

Figure 4B:
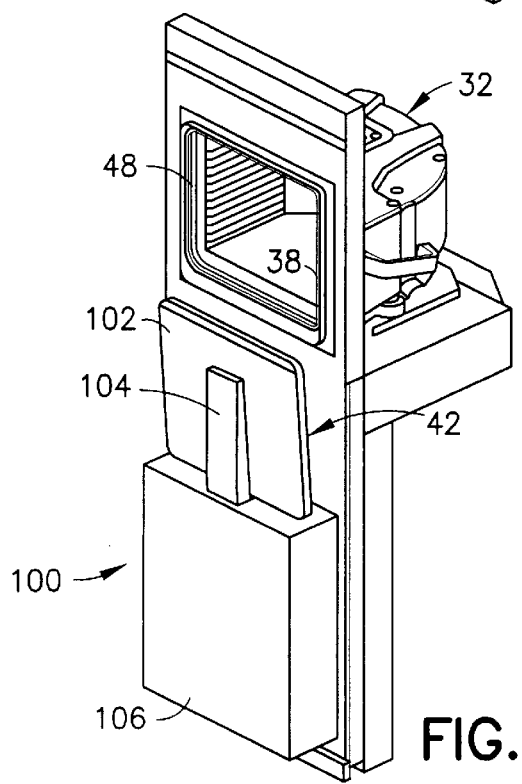
FIG. 4B is a perspective view, similar to FIG. 4A with the carrier door open.

At such time that the carrier door 42 has been thereby released from the carrier and the suction cups 110 effective to support the carrier door firmly engaged against the door opener 102, the transport member 104 is pivoted to the dashed-line position illustrated in FIG. 6, then caused to descend to the lowered position illustrated in FIG. 4B. The shuttle actuator 96 is then again operated to advance the carrier 32 through the aperture 72 and into the mini-environment 58 (see FIG. 6B). Because the seal 74 peripherally engages the housing 37 of the carrier, the mini-environment again becomes isolated from the surrounding atmosphere. Suitable pumps (not shown) may be operated to evacuate the chamber 76 or to introduce inert gases at this stage of the operation of the processing system 20.

With the carrier door 42 so positioned adjacent the load lock door 80, a load lock door drive mechanism 118 is then operated for moving the load lock door. In the closed position, the load lock door 80 is held firmly against a suitable seal 120 (FIG. 6) interposed between the load lock door and the load lock 22 for isolating the load lock chamber 76 from the atmosphere. The load lock door drive mechanism 118 includes a drive actuator 122 mounted on a base 124 of the mini-environment 58. The drive actuator 122 is vertically disposed with a drive actuator shaft 123 suitably attached to the load lock door 80 to move it between its raised closed position and a lowered open position remote from the region intermediate the carrier and the load lock chamber 76.

It will be appreciated that operation of the multilevel wafer receiving station 84 cannot be achieved until the drive mechanism 118 has been operated to move the load lock door, the coupling device, and the carrier door 42 all to the lowered position. The entire sequence of operations is sequentially depicted in FIGS. 8A–8H, as indicated in FIG. 8. While the sequence of operations in FIGS. 8A–8H is directed toward loading the wafer receiving station 84, the reverse order of operations may be performed to unload the wafer receiving station.

Viewing FIG. 6, an index drive mechanism 126 is provided for vertically moving the wafer receiving station 84. The index drive mechanism 126 includes a suitable index actuator 128 which is of the type which can advance an index actuator shaft 130, as desired, either in a macro fashion rapidly over a relatively long distance or in a micro fashion, that is, in incremental steps. Thus, the index actuator, in one mode of operation, can move the load lock arm between an active position at which all of the support plates 92 are aligned with their associated rack members 36 in the interior 40 of the carrier 42 and an inactive position at which all of the support plates are not so aligned with their associated rack members. Of course, while the index drive mechanism 126 is illustrated as being associated with the load lock 22, it may just as properly be a part of the platform 60 for supporting the carrier 32.

It was previously mentioned that a transport arm 97 within the transport chamber 28 may be operated for retrieving the wafers 34, one at a time, from the multilevel wafer receiving station 84 and delivering it to a specified one of the plurality of processing stations 24. The index drive mechanism 126 may also be operated in its incremental mode to adjust the level of a particular wafer processing station set 24 with robot end effector fingers 138 on the transport arm 97 within the transport chamber 28. In this manner, the transport arm 97 driven by a transport actuator 140 is effective to retrieve wafers one at a time from the multilevel wafer receiving station 84 for delivery to a specified one of the processing stations 24. The transport arm 97 and its associated transport actuator 140 may be of the construction disclosed in commonly assigned U.S. Pat. No. 5,180,276 to Hendrickson.

A suitable isolation valve 30, previously mentioned, is provided intermediate the load lock chamber 76 and the transport chamber 28. The isolation valve is sufficiently large to permit passage therethrough of the robot end effector fingers supporting a wafer 34 and is selectively operable to permit fluid intercommunication between the load lock chamber and the transport chamber in one instance and to prevent fluid intercommunication therebetween. Of course, failure to permit fluid intercommunication between the chambers also results in prevention of passage therethrough of the robot end effector fingers supporting a wafer 34. Additionally, a suitable seal 142 is interposed between the load lock 22 and the transport chamber 28 for isolating the load lock and the transport chamber from the surrounding atmosphere when the isolation valve is positioned to permit fluid intercommunication between the load lock chamber and the transport chamber.

A source of vacuum 144 is provided for selectively evacuating the load lock chamber 76 and the transport chamber 28. A conduit 146 extends between the source of vacuum 144 and the load lock chamber and a selectively operable valve 148 in the conduit 146 interconnects the vacuum source and the load lock chamber 76 when the load lock door 80 is closed and disconnects the vacuum source from the load lock chamber when the load lock door is open. In a similar manner, a conduit 150 extends between the source of vacuum 144 and the transport chamber. A selectively operable valve 152 in the conduit 150 interconnects the vacuum source and the transport chamber when the transport chamber is isolated from the surrounding atmosphere.

While preferred embodiments of the invention have been disclosed in detail, it should be understood by those skilled in the art that various other modifications may be made to the illustrated embodiments without departing from the scope of the invention as described in the specification and defined in the appended claims.

What is claimed is:

1. A system for batch loading semiconductor wafers comprising:
    a portable carrier for supporting and transporting in a substantially particle free environment a plurality of the wafers in substantially spaced relationship, said carrier having a carrier port for providing access to the interior thereof;
    a carrier door on said carrier movable between a closed position overlying said carrier port for sealing the interior of said carrier from the surrounding environment and an open position spaced from said carrier port; and
    a platform for selectively supporting said carrier thereon, said carrier being movable on said platform between a withdrawn position distant from a wafer receiving station and an advanced position at the wafer receiving station for delivering the plurality of wafers thereto as a grouping;
    wherein said carrier has a plurality of spaced rack members for supporting the wafers thereon, each of said plurality of spaced rack members being aligned with an associated one of a plurality of spaced shelves on the wafer receiving station.

2. A system as set forth in claim 1
    wherein said carrier has a plurality of generally horizontal, vertically spaced, rack members for supporting the wafers thereon, each of said plurality of spaced rack members being aligned with an associated one of a plurality of generally horizontal, vertically spaced, shelves on the wafer receiving station for reception of the wafers thereon in a stacked relationship.

3. A system as set forth in claim 1 including:

a load lock defining a chamber therein having a substantially particle free environment and including a load lock port opening into the load lock chamber;

a load lock door on said load lock movable between a closed position overlying said load lock port and an open position spaced therefrom; and a wafer receiving station within the chamber of said load lock;

wherein said carrier has a plurality of generally horizontal, vertically spaced, rack members for supporting the wafers thereon, and wherein said wafer receiving station includes a plurality of generally horizontal, vertically spaced, shelves for reception from said carrier of the wafers thereon in a stacked relationship, each of said plurality of spaced shelves being aligned with an associated one of said rack members of said carrier.

4. A system as set forth in claim 3 including:

a load lock door drive mechanism for moving said load lock door between the closed and open positions.

5. A system as set forth in claim 3 including:

seal means between said load lock door and said load lock for isolating the load lock chamber from the atmosphere when said load lock door is in the closed position.

6. A system as set forth in claim 3 including:

a load lock door drive mechanism for moving said load lock door between the closed and open positions; and a carrier door drive mechanism for moving said carrier door between the closed and open positions when said load lock door is in the open position.

7. A system as set forth in claim 6 including:

a transport chamber for receiving wafers for transfer to a plurality of processing stations; and a transport aim within said transport chamber for retrieving wafers one at a time from said wafer receiving station and delivering it to a specified one of the plurality of processing stations.

8. A system as set forth in claim 3 including:

lifting means for incrementally lowering said wafer receiving station as said carrier is moved on said platform between the withdrawn position distant therefrom and the advanced position for delivering the plurality of wafers thereto as a grouping, then incrementally raising said wafer receiving station to accept the plurality of wafers thereon.

9. A system as set forth in claim 3 including:

an isolation housing for sealingly isolating the load lock chamber and the interior of the carrier from the surrounding atmosphere.

10. A system as set forth in claim 9 wherein said isolation housing has an aperture generally aligned with said load lock port but spaced therefrom and includes a platform for supporting said carrier thereon such that said carrier port is proximate the aperture in said isolation housing; and including:

seal means between said isolation housing and said carrier when supported on said platform and encompassing said carrier port and the aperture in said isolation housing for isolating the interior of said carrier, the interior of said isolation housing and the load lock chamber from the surrounding atmosphere.

11. A system as set forth in claim 1 including:

a carrier door drive mechanism for moving said carrier door between the closed and open positions.

12. A system as set forth in claim 11 wherein said carrier door includes locking means operable for releasably locking said carrier door to said carrier at said carrier port; and wherein said carrier door drive mechanism includes:

a generally planar door opener movable between a lowered position and a raised position substantially coextensive with said carrier port, said door opener also being movable between a first position proximate said carrier port and a second position distant from said carrier port; and removal means for operating said locking means to release said carrier door from said carrier port and for supporting said carrier door when said locking means has been operated to release said carrier door from said carrier.

13. A system as set forth in claim 12 wherein said locking means includes:

a plurality of latch members on said carrier door movable between a locking position engaged with respectively positioned locking recesses on said carrier adjacent said carrier port and a release position disengaged therefrom; and keyway means operably connected to said latch members for moving said latch members between said locking position and said release position; and wherein said removal means includes:

selectively operable suction means on said door opener engageable with said carrier door for firmly attaching said carrier door to said door opener; and key means on said door opener engageable with said keyway means on said carrier door for operating said latch members.

14. A system as set forth in claim 1 including:

shuttle means for moving said platform between the withdrawn position and the advanced position.

15. A system as set forth in claim 14 wherein said shuttle means includes:

a shuttle actuator; and an actuator rod kinematically connecting said shuttle actuator and said platform.

16. A system as set forth in claim 1 including:

seal means on said carrier adjacent said carrier port and engageable with said carrier door when said carrier door is in the closed position for sealing the interior of said carrier from the surrounding environment.

17. A system for batch loading semiconductor wafers comprising:

a portable carrier for supporting and transporting a plurality of the wafers in substantially spaced relationship, said carrier having a carrier port for providing access to the interior thereof;

a carrier door on said carrier movable between a closed position overlying said carrier port and an open position spaced from said carrier port;

a load lock defining a chamber therein and including a load lock port opening into the load lock chamber;

a load lock door on said load lock movable between a closed position overlying said load lock port and an open position spaced therefrom; and a platform for selectively supporting said carrier thereon, said carrier being movable on said platform between a withdrawn position distant from a wafer receiving station and an advanced position at the wafer receiving station for delivering the plurality of wafers thereto as a grouping;

wherein said carrier has a plurality of spaced rack members for supporting the wafers thereon, each of said plurality of spaced rack members being aligned with an associated one of a plurality of spaced shelves on the wafer receiving station.

18. A system as set forth in claim 17 wherein said carrier has a plurality of generally horizontal, vertically spaced, rack members for supporting the wafers thereon, each of said plurality of spaced rack members being aligned with an associated one of a plurality of generally horizontal, vertically spaced, shelves on the wafer receiving station for reception of the wafers thereon in a stacked relationship.

19. A system as set forth in claim 17 including:

a wafer receiving station within the chamber of said load lock;

wherein said carrier has a plurality of generally horizontal, vertically spaced, rack members for supporting the wafers thereon, and wherein said wafer receiving station includes a plurality of generally horizontal, vertically spaced, shelves for reception from said carrier of the wafers thereon in a stacked relationship, each of said plurality of spaced shelves being aligned with an associated one of said rack members of said carrier.

20. A system as set forth in claim 19 including:

a load lock door drive mechanism for moving said load lock door between the closed and open positions.

21. A system as set forth in claim 19 including:

a load lock door drive mechanism for moving said load lock door between the closed and open positions; and a carrier door drive mechanism for moving said carrier door between the closed and open positions when said load lock door is in the open position.

22. A system as set forth in claim 21 including:

a transport chamber for receiving wafers for transfer to a plurality of processing stations; and a transport arm within said transport chamber for retrieving wafers one at a time from said wafer receiving station and delivering it to a specified one of the plurality of processing stations.

23. A system as set forth in claim 21 wherein said carrier door includes locking means operable for releasably locking said carrier door to said carrier at said carrier port; and wherein said carrier door drive mechanism includes:
 a generally planar door opener movable between a lowered position and a raised position substantially coextensive with said carrier port, said door opener also being movable between a first position proximate said carrier port and a second position distant from said carrier port; and
 removal means for operating said locking means to release said carrier door from said carrier port and for supporting said carrier door when said locking means has been operated to release said carrier door from said carrier.

24. A system as set forth in claim 23 wherein said locking means includes:
 a plurality of latch members on said carrier door movable between a locking position engaged with respectively positioned locking recesses on said carrier adjacent said carrier port and a release position disengaged therefrom; and
 keyway means operably connected to said latch members for moving said latch members between said locking position and said release position; and wherein said removal means includes:
 selectively operable suction means on said door opener engageable with said carrier door for firmly attaching said carrier door to said door opener; and
 key means on said door opener engageable with said keyway means on said carrier door for operating said latch members.

25. A system as set forth in claim 19 including:

lifting means for incrementally lowering said wafer receiving station as said carrier is moved on said platform between the withdrawn position distant therefrom and the advanced position for delivering the plurality of wafers thereto as a grouping, then incrementally raising said wafer receiving station to accept the plurality of wafers thereon.

26. A system as set forth in claim 17 including:

an isolation housing for sealingly isolating the load lock chamber and the interior of the carrier from the surrounding atmosphere.

27. A system as set forth in claim 26 wherein said isolation housing has an aperture generally aligned with said load lock port but spaced therefrom and includes a platform for supporting said carrier thereon such that said carrier port is proximate the aperture in said isolation housing; and including:
 seal means between said isolation housing and said carrier when supported on said platform and encompassing said carrier port and the aperture in said isolation housing for isolating the interior of said carrier, the interior of said isolation housing and the load lock chamber from the surrounding atmosphere.

28. A system as set forth in claim 17 including:

seal means between said load lock door and said load lock for isolating the load lock chamber from the atmosphere when said load lock door is in the closed position.

29. A system as set forth in claim 17 including:

shuttle means for moving said platform between the withdrawn position and the advanced position.

30. A system as set forth in claim 29 wherein said shuttle means includes:
 a shuttle actuator; and
 an actuator rod kinematically connecting said shuttle actuator and said platform.

31. A system as set forth in claim 17 including:

seal means on said carrier adjacent said carrier port and engageable with said carrier door when said carrier door is in the closed position for sealing the interior of said carrier from the surrounding environment.

32. A system as set forth in claim 17 including:

a carrier door drive mechanism for moving said carrier door between the closed and open positions.

33. A system for batch loading semiconductor wafers comprising:

a platform for selectively supporting thereon a portable carrier for supporting and transporting in a substantially particle free environment a plurality of the wafers in substantially spaced relationship, the carrier having a plurality of generally horizontal, vertically spaced, rack members for supporting the wafers thereon, a carrier port for providing access to the interior thereof and a carrier door movable between a closed position overlying the carrier port for sealing the interior of the carrier from the surrounding environment and an open position spaced from the carrier port, the carrier being movable on the platform between a withdrawn position distant from a wafer receiving station and an advanced position at the wafer receiving station for delivering the plurality of wafers thereto as a grouping, each of said plurality of spaced rack members being aligned with an associated one of a plurality of spaced shelves on the wafer receiving station.

34. A system as set forth in claim 22 including:

a load lock defining a chamber therein having a substantially particle free environment and including a load lock port opening into the load lock chamber;

a load lock door on said load lock movable between a closed position overlying said load lock port and an open position spaced therefrom; and a wafer receiving station within the chamber of said load lock, including a plurality of generally horizontal, vertically spaced, shelves for reception from the carrier of the wafers thereon in a stacked relationship, each of said plurality of spaced shelves being aligned with an associated one of a plurality of the generally horizontal, vertically spaced, rack members of the carrier for supporting the wafers thereon.

35. A system as set forth in claim 34 including:

a load lock door drive mechanism for moving said load lock door between the closed and open positions.

36. A system as set forth in claim 34 including:

a load lock door drive mechanism for moving said load lock door between the closed and open positions; and a carrier door drive mechanism for moving the carrier door between the closed and open positions when said load lock door is in the open position.

37. A system as set forth in claim 36 including:

a transport chamber for receiving wafers for transfer to a plurality of processing stations; and a transport arm within said transport chamber for retrieving wafers one at a time from said wafer receiving station and delivering it to a specified one of the plurality of processing stations.

38. A system as set forth in claim 34 including:

lifting means for incrementally lowering said wafer receiving station as the carrier is moved on said platform between the withdrawn position distant therefrom and the advanced position for delivering the plurality of wafers thereto as a grouping, then incrementally raising said wafer receiving station to accept the plurality of wafers thereon.

39. A system as set forth in claim 33 including:

a carrier door drive mechanism for moving the carrier door between the closed and open positions.

40. A system as set forth in claim 33 including:

an isolation housing for sealingly isolating the load lock chamber and the interior of the carrier from the surrounding atmosphere.

41. A system as set forth in claim 40 wherein said isolation housing has an aperture generally aligned with said load lock port but spaced therefrom and includes a platform for supporting said carrier thereon such that the carrier port is proximate the aperture in said isolation housing; and including:

seal means between said isolation housing and the carrier when supported on said platform and encompassing the carrier port and the aperture in said isolation housing for isolating the interior of the carrier, the interior of said isolation housing and the load lock chamber from the surrounding atmosphere.

42. A system as set forth in claim 33 including:

seal means between said load lock door and said load lock for isolating the load lock chamber from the atmosphere when said load lock door is in the closed position.

43. A system as set forth in claim 33 including:

shuttle means for moving said platform between the withdrawn position and the advanced position.

44. A system as set forth in claim 43 wherein said shuttle means includes:
a shuttle actuator; and
an actuator rod kinematically connecting said shuttle actuator and said platform.

* * * * *